United States Patent
Chen (10) Patent No.: US 9,218,780 B2
(45) Date of Patent: Dec. 22, 2015

(54) GATE DRIVING CIRCUIT, ARRAY SUBSTRATE, AND DISPLAY APPARATUS

(71) Applicant: Beijing BOE Optoelectronics Technology Co., Ltd., Beijing (CN)

(72) Inventor: Xi Chen, Beijing (CN)

(73) Assignee: BEIJING BOE OPTOELECTRONICS TECHNOLOGY CO., Ltd., Beijing (CN)

(*) Notice: Subject to any disclaimer, the term of this patent is extended or adjusted under 35 U.S.C. 154(b) by 148 days.

(21) Appl. No.: 14/025,112

(22) Filed: Sep. 12, 2013

(65) Prior Publication Data

US 2014/0078124 A1 Mar. 20, 2014

(30) Foreign Application Priority Data

Sep. 20, 2012 (CN) .......................... 2012 2 0482889

(51) Int. Cl.
 G09G 3/36 (2006.01)
 G09G 3/32 (2006.01)
 G11C 19/28 (2006.01)

(52) U.S. Cl.
 CPC ............ *G09G 3/3696* (2013.01); *G09G 3/3266* (2013.01); *G09G 3/3677* (2013.01); *G11C 19/287* (2013.01); *G09G 2310/0267* (2013.01); *G09G 2310/0286* (2013.01); *G09G 2320/043* (2013.01)

(58) Field of Classification Search
 CPC ............................................. G09G 2310/0286
 See application file for complete search history.

(56) References Cited

U.S. PATENT DOCUMENTS

| 2007/0216634 | A1* | 9/2007 | Kim et al. ...................... 345/100 |
| 2008/0231617 | A1* | 9/2008 | Miyake et al. ................ 345/204 |
| 2009/0085903 | A1  | 4/2009 | Yamashita et al. |
| 2010/0238143 | A1  | 9/2010 | Liu et al. |
| 2010/0238156 | A1* | 9/2010 | Iwamoto et al. .............. 345/213 |
| 2010/0245301 | A1  | 9/2010 | Shang |
| 2011/0150169 | A1* | 6/2011 | Lin et al. ......................... 377/64 |

(Continued)

FOREIGN PATENT DOCUMENTS

| JP | 2009080367 A  | 4/2009 |
| KR | 1020090033008 A | 4/2009 |
| KR | 20100108301 A | 10/2010 |

OTHER PUBLICATIONS

Office Action issued by the Korean Patent Office for Korean Patent Application No. 10-2013-7010106 dated Jun. 30, 2014, 3pgs.

(Continued)

*Primary Examiner* — Gene W Lee (57) ABSTRACT

The present disclosure relates to a field of displaying, and particularly to a gate driving circuit, an array substrate, and a display apparatus capable of ensuring that noise can be pulled down immediately once it occurs, and thus increasing a quality of picture and reliability of the display apparatus. The gate driving circuit includes a plurality of cascaded shift registers, wherein an output terminal of the shift register is further connected to two Thin Film Transistors TFTs, wherein sources of the two TFTs are both connected to the output terminal of the shift register, drains of the two TFTs are both connected to a first level signal line VSS, and gates of the two TFTs are input to different control signals respectively, thus ensuring that at least one TFT is turned on when the shift register outputs a switching-off voltage.

11 Claims, 6 Drawing Sheets

(56) References Cited

U.S. PATENT DOCUMENTS

| | | | |
|---|---|---|---|
| 2011/0317803 A1* | 12/2011 | Chiu et al. | 377/67 |
| 2012/0256817 A1* | 10/2012 | Chen et al. | 345/92 |
| 2013/0033468 A1* | 2/2013 | Takahashi | 345/204 |
| 2013/0127797 A1* | 5/2013 | Tseng et al. | 345/204 |
| 2013/0136224 A1* | 5/2013 | Qing et al. | 377/64 |
| 2014/0064439 A1* | 3/2014 | Qing et al. | 377/75 |

OTHER PUBLICATIONS

English translation of Office Action issued by the Korean Patent Office for Korean Patent Application No. 10-2013-7010106 dated Jun. 30, 2014, 3pgs.

The extended European search report issued by the European Patent Office on Jan. 14, 2014 for International Application No. 13184230.0, 24 pages.

Notice of Allowance (Korean language) issued by the Korean Patent Office on Mar. 30, 3015 for application No. 020972158 (2 pages).

English translation of Notice of Allowance, 1 page.

EPO Communication (Office Action) pursuant to Article 94(3) EPC dated Apr. 17, 2015, 4 pages.

English Abstract of KR1020090033008A; 2 pgs.

English Abstract of KR20100108301A; 2 pgs.

English Abstract of JP2009080367A; 2 pgs.

* cited by examiner

GATE DRIVING CIRCUIT, ARRAY SUBSTRATE, AND DISPLAY APPARATUS

CROSS REFERENCE TO RELATED APPLICATIONS

This application claims priority from Chinese National Application No. 201220482889.8 filed on Sep. 20, 2012, the contents of which are incorporated herein by reference.

TECHNICAL FIELD OF THE DISCLOSURE

The present disclosure relates to a field of displaying, and particularly to a gate driving circuit, an array substrate, and a display apparatus.

BACKGROUND

Gate Driver on Array (GOA) technique is a kind of process technique for integrating Gate Driver ICs directly on an array substrate to replace external driver ICs. Application of such technique may not only reduce a manufacturing process procedure and thus a product cost and increase an integration, but also may accomplish a design with two symmetric sides of a panel and omit a bonding area and a fan-out wiring space for the gate ICs, such that a narrow frame design may be achieved, thus increasing productivity and yield rate.

Figure 1:
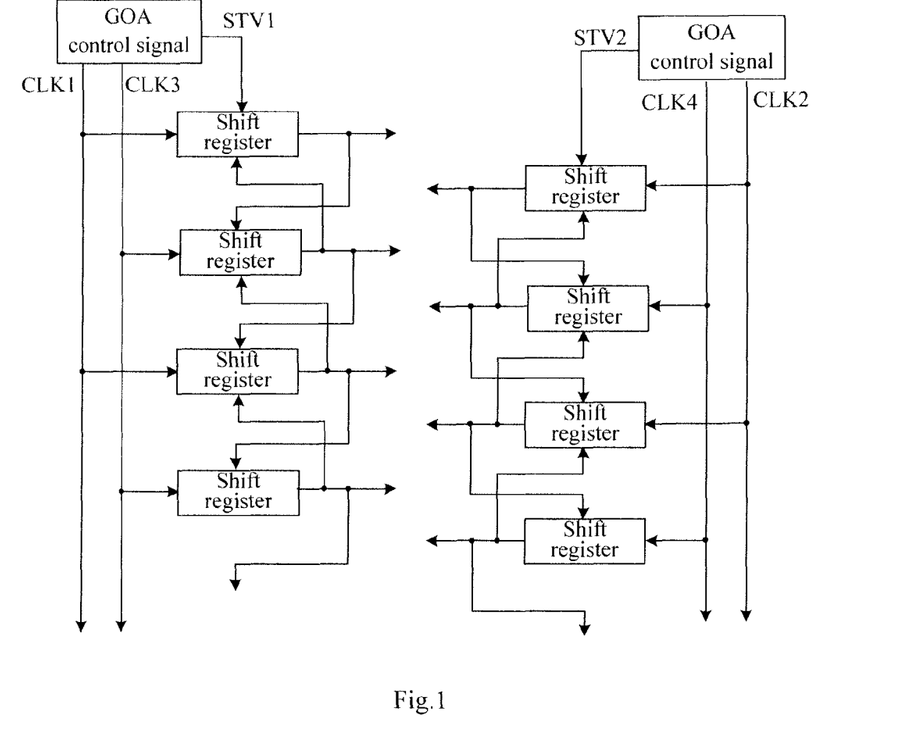
FIG. 1 is a schematic structure diagram of a bi-side alternate driving circuit in the prior art.
Figure 2:
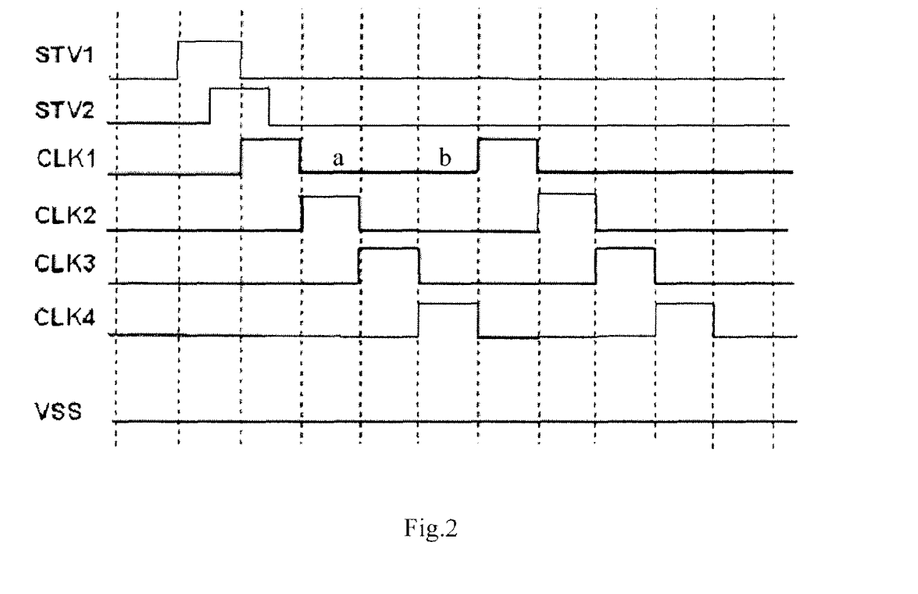
FIG. 2 is a timing sequence signal diagram of the bi-side alternate driving circuit in the prior art.
Figure 3:
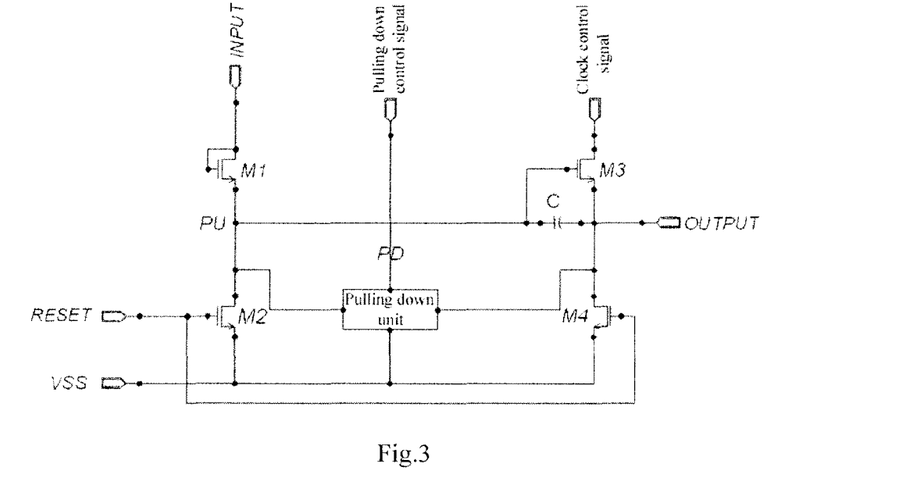
FIG. 3 is a schematic structure diagram of a shift register in the prior art.

FIG. 1 is a schematic diagram of GOA for bi-side parity alternate driving circuit of a display apparatus which includes two sets of cascaded shift registers on the left and on the right respectively, FIG. 2 shows the controlling timing sequence signals for operation of the shift register, FIG. 3 shows a circuit design of the shift register, wherein a pulling-down control signal may be connected to a direct current signal source or an alternating current signal source. The two sets of cascaded shift registers on the left and on the right respectively have a same operational principle, taking the circuit on the left (that is, the circuit for odd rows) in FIG. 1 as an example, an output of a previous odd row is connected to an input terminal (INPUT) of a current odd row shift register, and an output of a next odd row is connected to a reset terminal (RESET) of the current odd row shift register. The basic operational principle is as follows: when a signal at the INPUT terminal is at a high level, a first transistor M1 is turned on to charge a node PU; when a clock control signal (it is a first clock control signal CLK1 for a first row, a fifth row, a ninth row and so on, and it is a third clock control signal CLK3 for a third row, a seventh row, an eleventh row and so on) is at a high level, a third transistor M3 is turned on and the OUTPUT terminal outputs a pulse of a high level, meanwhile the bootstrapping function of a capacitor C1 may further pull up the voltage at the node PU; then the RESET terminal is at a high level, a second transistor M2 and a fourth transistor M4 are turned on to discharge the node PU and the OUTPUT terminal; then the node PD is controlled to be charged by a pulling-down control signal, such that the node PU and the OUTPUT terminal are discharged, thus ensuring that noise is pulled down in a non-operational time of the current row.

When a direct current signal is selected as the pulling down control signal, the node PU can be charged constantly, thus ensuring that noises at the node PU and the OUTPUT terminal may be pulled down immediately once they occur. Nevertheless, there is a problem that a Thin Film Transistor (TFT) in a pulling down unit for controlling the node PD is always in an operational state in which the duty cycle is nearly 100%, such that a lifespan of the TFT may be reduced largely and a long-term reliability and stability of the GOA circuit will be affected severely. When an alternating current signal (usually a clock control signal) is selected as the pulling down control signal, the lifespan of the TFT in the pulling down unit may be effectively increased; however, since the node PD is controlled by the alternating current signal, there is a low level state at the node PD, and at this time, the noises at the node PU and the OUTPUT terminal cannot be pulled down in time once they occur due to the low level of the node PD, such that abnormality is prone to appear in display, especially in a high temperature the higher noise is output.

SUMMARY

Embodiments of the present disclosure provide a gate driving circuit, an array substrate, and a display apparatus, capable of ensuring that noise may be pulled down immediately once it occurs, and thus increasing a quality of picture and reliability of the display apparatus.

According to one aspect, embodiments of the present disclosure provide a gate driving circuit including a plurality of cascaded shift registers, wherein an output terminal of the shift register is further connected to two Thin Film Transistors TFTs, sources of the two TFTs are both connected to the output terminal of the shift register, drains of the two TFTs are both connected to a first level signal line, and gates of the two TFTs are input into different control signals respectively, thus ensuring that at least one TFT is turned on when the shift register outputs a switching-off voltage.

According to an embodiment, the first level signal line is a low voltage signal line Vss, and the switching-off voltage is a low level voltage.

Particularly, except for a first shift register and a last shift register, for each of other shift registers, an output terminal of the shift register is connected to an input terminal of a next adjacent shift register and a reset signal input terminal of a previous adjacent shift register, an output terminal of the first shift register is connected to an input terminal of a second shift register, an output terminal of the last shift register is connected to a reset signal input terminal of a previous adjacent shift register and a reset signal input terminal of the last shift register; an input terminal of the first shift register inputs a frame start signal; for an odd numbered shift register, a first clock signal input terminal inputs a first clock signal, a second clock signal input terminal inputs a second clock signal; for an even numbered shift register, a first clock signal input terminal inputs the second clock signal, a second clock signal input terminal inputs the first clock signal; a low voltage signal input terminal of each of the shift registers inputs a low voltage signal; each of the shift registers is connected to a corresponding gate line, wherein the different control signals include a first control signal and a second control signal.

Preferably, the gate driving circuit includes two sets of cascaded shift registers, wherein each of the shift registers in a first set of cascaded shift registers is connected to a corresponding odd row gate line, and each of the shift registers in a second set of cascaded shift registers is connected to a corresponding even row gate line; wherein the first clock signal and the second clock signal of the first set of cascaded shift registers function respectively as the first control signal and the second control signal of the two TFTs connected to a corresponding shift register of the second set of cascaded shift registers, and the first clock signal and the second clock signal of the second set of cascaded shift registers function respectively as the first control signal and the second signal of the two TFTs connected to a corresponding shift register of the first set of cascaded shift registers.

Preferably, the first clock signal and the second clock signal of the first set of cascaded shift registers have reversed phases, the first clock signal and the second clock signal of the second set of cascaded shift registers also have reversed phases, and the first clock signal of the second set of cascaded shift registers lags the first clock signal of the first set of cascaded shift registers by ½ of a pulse width.

Preferably, the first clock signal of the first set of cascaded shift registers, the first clock signal of the second set of cascaded shift registers, the second clock signal of the first set of cascaded shift registers, the second clock signal of the second set of cascaded shift registers are output sequentially in a pulse period.

Optionally, for each of the shift registers, the output terminal is connected to two TFTs via a gate line connected to the shift register; one terminal of the gate line is connected to the output terminal of the shift register, and the other terminal of the gate line is connected to sources of the two TFTs.

Optionally, the two TFTs are Metal Oxide Semiconductor Field Effect Transistors.

According to another aspect of the present disclosure, embodiments of the present disclosure further provides an array substrate in which any of the gate driving circuits is arranged.

Optionally, the first set of cascaded shift registers and the second set of cascaded shift registers locate at edges of two opposite sides on the array substrate, respectively.

Preferably, two TFTs connected to a corresponding shift register of the first set of cascaded shift registers locate at an edge of a side opposite to the first set of cascaded shift registers on the array substrate; and two TFTs connected to a corresponding shift register of the second set of cascaded shift registers locate at an edge of a side opposite to the second set of cascaded shift registers on the array substrate.

Further preferably, for each of the shift registers of the first set and the second set of cascaded shift registers, the output terminal is connected to two TFTs at the opposite side via the gate line connected to the shift register.

The embodiments of the present disclosure further provide a display apparatus in which any of the array substrate is arranged.

In the gate driving circuit, the array substrate and the display apparatus provided in the embodiments of the present disclosure, two TFTs are added at the output terminal of each of the shift registers, sources of the two TFTs are both connected to the output terminal of the shift register, drains of the two TFTs are both connected to the first level signal line (e.g., a low voltage signal line VSS), and gates of the two TFTs are connected to different control lines respectively to input clock control signals, such that the output terminal of the shift register is always connected to the low voltage signal line VSS via one of the two TFTs during period other than the period in which a high level is output, it is ensured that noise at the output terminal will be pulled down in time when it occurs, thus increasing quality of picture and reliability of the display apparatus.

BRIEF DESCRIPTION OF THE DRAWINGS

In order to explain the technical solutions in the embodiments of the present disclosure or in the prior art more clearly, accompanying drawings required for describing the embodiments of the present disclosure or the prior art will be introduced. Obviously, the accompanying drawings below only show some embodiments of the present disclosure, and based on the accompanying drawings, other accompanying drawings can be obtained by those skilled in the art without paying inventive labor.

DETAILED DESCRIPTION

Embodiments of the present disclosure provide a gate driving circuit, an array substrate and a display apparatus capable of ensuring that the noise will be pulled down in time when it occurs, thus increasing quality of picture and reliability of the display apparatus.

Descriptions will be made clearly and thoroughly for the technical solutions in the embodiments of the present disclosure below, taken in conjunction with the accompanying drawings of the embodiments of the present disclosure. Obviously, the described embodiments are only some but not all of the embodiments of the present disclosure. Other embodiments obtained by those skilled in the art based on the described embodiments without paying inventive labor shall belong to the scope sought for protection in the present disclosure.

First Embodiment

Figure 4:
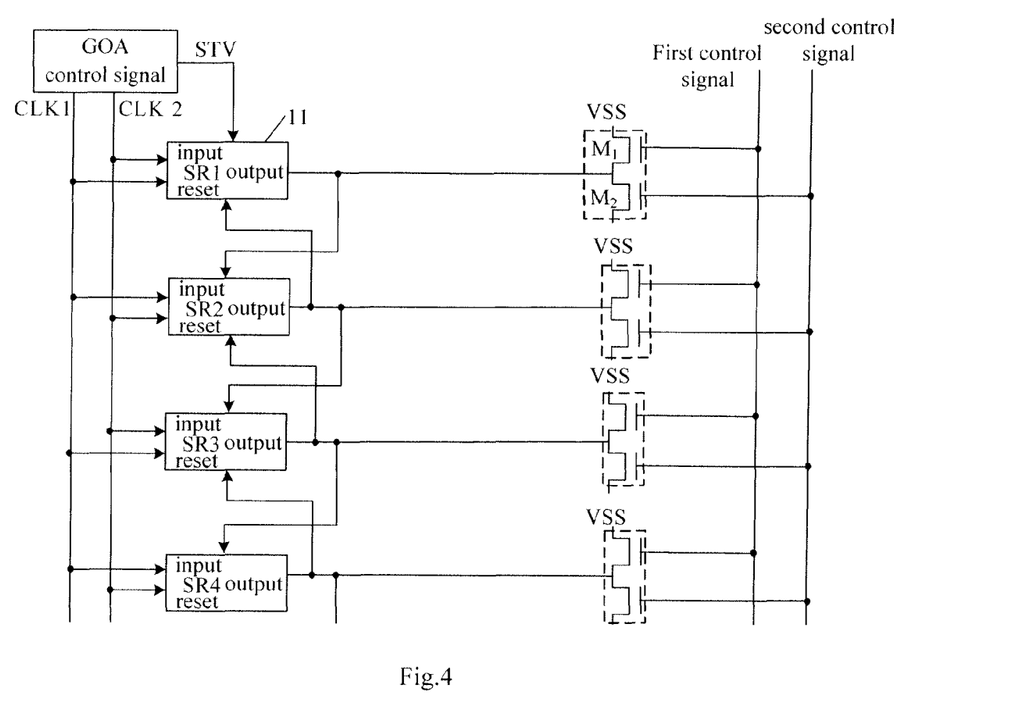
FIG. 4 is a first schematic structure diagram of a gate driving circuit in an embodiment of the present disclosure.

The gate driving circuit provided in an embodiment of the present disclosure is as shown in FIG. 4, and includes: a plurality of cascaded shift registers 11, an output terminal of the shift register 11 is connected to two Thin Film Transistors (TFTs) $M_1$ and $M_2$, wherein sources of the two TFTs $M_1$ and $M_2$ both are connected to the output terminal of the shift register 11, drains of the two TFTs $M_1$ and $M_2$ both are connected to a low voltage signal line VSS, and gates of the two TFTs $M_1$ and $M_2$ are connected to different control lines respectively, such that at least one TFT is turned on when the shift register 11 outputs a low level.

It should be noted that the source and drain may be exchanged to each other since the source and drain of the TFT are symmetric. In the embodiment of the present disclosure, in order to distinguish two electrodes other than the gate of the TFT, one of the two electrodes is referred to as a source and the other is referred to as a drain. When the source is selected as a signal input terminal, the drain is used as a signal output terminal, and vice versa. In addition, in case of the TFTs $M_1$ and $M_2$ being the transistors of N type, the sources of the two TFTs $M_1$ and $M_2$ both are connected to the output terminal of the shift register 11, the drains of the two TFTs $M_1$ and $M_2$ both are connected to the low voltage signal line VSS, and the gates of the two TFTs $M_1$ and $M_2$ are connected to different control lines respectively, such that at least one TFT is turned on when the shift register 11 outputs a switching-off voltage (e.g., a low level voltage). If the transistors of P type are adopted as the TFTs $M_1$ and $M_2$, the drains of the two TFTs $M_1$ and $M_2$ both are connected to a high voltage signal line, such that at least one TFT is turned on when the shift register 11 outputs a switching-off voltage (e.g., a high level voltage). Preferably, the Thin Film Transistors adopted in the shift register 11 and the two TFTs $M_1$ and $M_2$ are of the same type. In the embodiments of the disclosure, all of the Thin Film Transistors are N type transistors for the purpose of illustration.

Wherein, each of gate lines is connected to a corresponding shift register 11, and the plurality of cascaded shift registers 11 are named as SR1~SRn in an order of the row number of gate lines, wherein n is a natural number other than 0. The shift registers are connected in cascade from top to down, except for a first shift register and a last shift register, an output terminal of each of the other shift registers is connected to an input terminal of a next adjacent shift register and a reset signal input terminal of a previous adjacent shift register, an output terminal of the first shift register is connected to an input terminal of a second shift register, and an output terminal of the last shift register is connected to a reset signal input terminal of a previous adjacent shift register and a reset signal input terminal of the last shift register; a input terminal of the first shift register SR1 is input a frame start signal STV; for an odd numbered shift register, a first clock signal input terminal is input a first clock signal CLK1, and a second clock signal input terminal is input a second clock signal CLK2; for an even numbered shift register, a first clock signal input terminal is input the second clock signal CLK2, and a second clock signal input terminal is input the first clock signal CLK1; the low voltage signal input terminal of each of the shift registers is input a low voltage signal VSS (not shown in FIG. 4).

The gates of the two TFTs $M_1$ and $M_2$ are connected to different control lines respectively, such that two complementary control signals (the first control signal and second control signal as shown in FIG. 4) can be input, so as to ensure that at least one TFT is turned on when the shift register 11 outputs the low level signal. In a particular implementation, two control signals having reversed phases are input to the gates of the two TFTs $M_1$ and $M_2$ respectively through the control lines.

Two clock signal lines and two control lines included in the embodiment of the present disclosure output the signal CLK1, the first control signal, the signal CLK2 and the second control signal respectively, wherein the first control signal lags the signal CLK1 by ½ of a pulse width, the second control signal lags the signal CLK2 by ½ of a pulse width. Pulse signals of the CLK1 and CLK2 have reversed phases, and pulse signals of the first control signal and the second control signal have reversed phases; alternatively, the signal CLK1, the first control signal, the signal CLK2 and the second control signal are output sequentially in a pulse period.

Preferably, high levels in the signal CLK1, the first control signal, the signal CLK2 and the second control signal are output sequentially in a pulse period.

The shift register in the embodiment of the present disclosure may be the shift register as shown in FIG. 3; for example, the clock control signal can be CLK1 or CLK2, and the pulling-down control signal corresponds to CLK2 or CLK1; as mentioned above, the pull-down control signal can also be a direct current signal. The specific effect of the present disclosure is not affected whichever shift register is used, and thus the present embodiment does not make any limitation on this.

In the embodiment of the present disclosure, two TFTs are added at the output terminal of each of the shift registers, such that the shift register is always connected to the low voltage signal line VSS via at least one of the two TFTs in the period other than the period in which the shift register outputs a high level signal, it is ensured that the output terminal can be pulled down in time when the noise occurs therein, thus increasing quality of picture and reliability of the display apparatus.

Preferably, the output terminal of each of the shift registers 11 is connected to two TFTs $M_1$ and $M_2$ via the gate line connected to the shift register 11, that is, one terminal of the gate line is connected to the output terminal of the shift register, and the other terminal of the gate line is connected to the two TFTs, such that the output terminal can be pulled down in time once the noise occurs, and a current leakage and a display defect due to a floating gate may be improved, thus increasing the quality of picture and reliability of the display apparatus.

An embodiment of the present disclosure further provides an array substrate and a display apparatus having any of the gate driving circuits arranged therein.

In the array substrate and the display apparatus provided in the embodiment of the present disclosure, since the gate driving circuit is arranged, the noise can be pulled down in time once it occurs, and a leakage current and a display defect caused by a floating gate may be improved, thus increasing quality of picture and reliability of the display apparatus.

Second Embodiment

Figure 5:
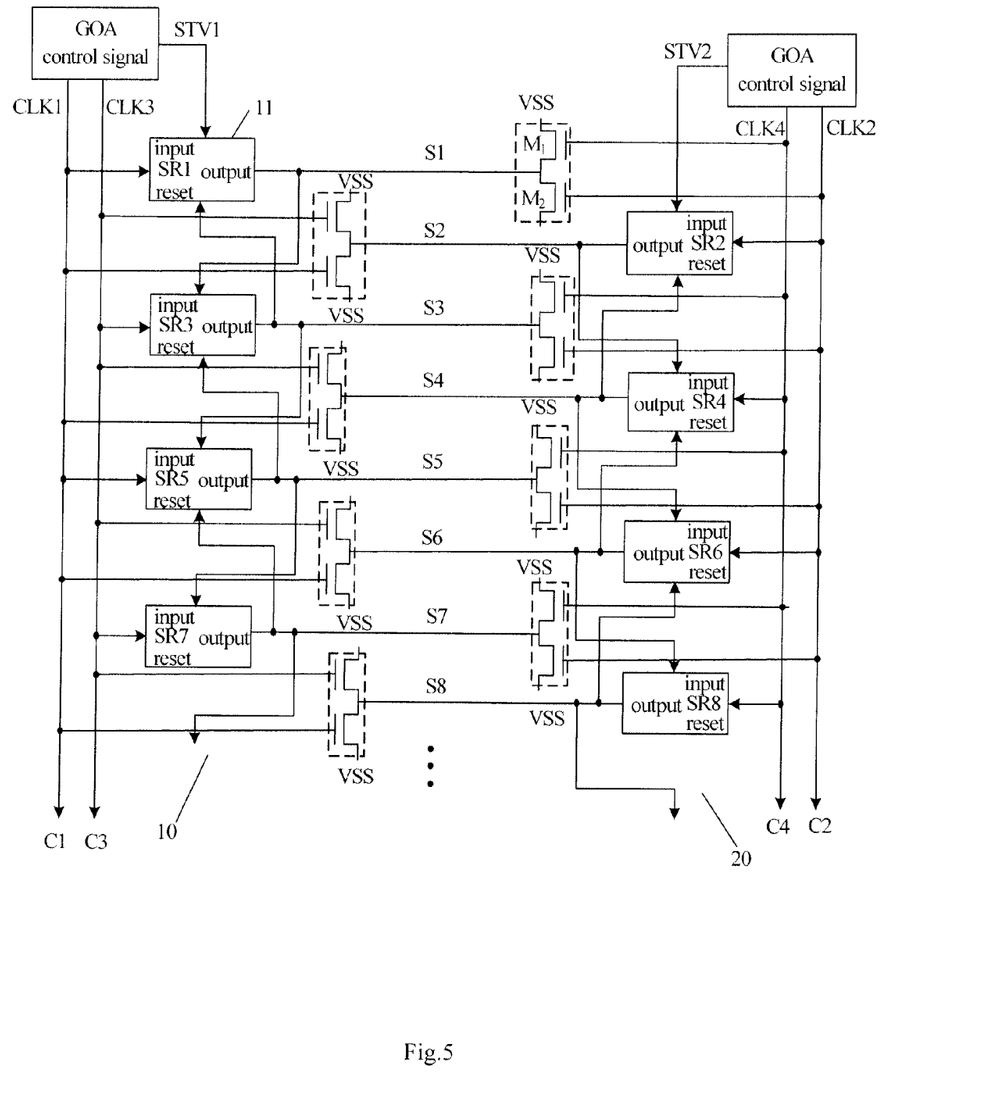
FIG. 5 is a second schematic structure diagram of a gate driving circuit in an embodiment of the present disclosure.

An gate driving circuit provided in an embodiment of the present disclosure is as shown in FIG. 5, and includes: a first set of cascaded shift registers (hereinafter referred to as a first set) 10, wherein each of the shift registers 11 is connected to an odd numbered gate line; a second set of cascaded shift registers (hereinafter referred to as a second set) 20, wherein each of the shift registers 11 is connected to an even numbered gate line; a first control line C1 and a third control line C3 connected to two adjacent shift registers 11 in the first set 10 respectively; a second control line C2 and a fourth control line C4 connected to two adjacent shift registers 11 in the second set 20 respectively; wherein an output terminal of each of the shift registers 11 in each set is connected to two parallel Thin Film Transistors (TFTs) $M_1$ and $M_2$, drains of the two TFTs $M_1$ and $M_2$ both are connected to a low voltage signal line VSS, and sources of the two TFTs $M_1$ and $M_2$ both are connected to the output terminal of the shift register 11; when the shift register 11 belongs to the first set 10, gates of the two TFTs $M_1$ and $M_2$ connected to the shift register 11 are connected to the second control line C2 and the fourth control line C4 respectively, and when the shift register 11 belongs to the second set 20, the gates of the two TFTs $M_1$ and $M_2$ connected to the shift register 11 are connected to the first control line C1 and the third control line C3 respectively;

Wherein each of the gate lines is connected to a corresponding shift register 11, and the plurality of shift registers 11 are named as SR1~SRn in an order of the row number of gate lines, wherein n is an integer other than 0. For example, the shift register SRn is connected to an $n^{th}$ gate line for driving the $n^{th}$ gate line. The shift registers connected to odd numbered gate lines are connected in cascade and constitute the first set 10, and the shift registers connected to even numbered gate lines are connected in cascade and constitute the second set 20.

With reference to FIG. 5 and FIGS. 2~3, in the first set 10 of cascaded shift registers, except for a first shift register and a last shift register, an output terminal of each of the other shift registers is connected to an input terminal of a next adjacent shift register and a reset signal input terminal of a previous adjacent shift register; an output terminal of the first shift register is connected to an input terminal of a second shift register, and an output terminal of the last shift register is connected to a reset signal input terminal of a previous adjacent shift register and a reset signal input terminal of the last shift register; a input terminal of the first shift register is input a frame start signal STV; an odd numbered shift register in the first set 10, that is, a shift register for driving a $(4n-3)^{th}$ gate line (for example, a first gate line, a fifth gate line, a ninth gate line and so on), is connected to the first control line C1 and is input a first clock control signal CLK1, and a third clock control signal CLK3 is input as a pulling down control signal; an even numbered shift register in the first set 10, that is, a shift register for driving a $(4n-1)^{th}$ gate line (for example, a third gate line, a seventh gate line, an eleventh gate line and so on), is connected to the third control line C3 and is input the third clock control signal CLK3, and the first clock control signal CLK1 is input as the pulling down control signal; the low voltage signal input terminal of each of the shift registers is input a low voltage signal.

The connection relationship of the second set 20 of cascaded shift registers is similar to that of the first set 10 of cascaded shift registers, except that an odd numbered shift register therein, corresponding to a shift register for driving a $(4n-2)^{th}$ gate line (for example, a second gate line, a sixth gate line, a tenth gate line and so on), is connected to the second control line C2 and is input a second clock control signal CLK2, and a fourth clock control signal CLK4 is input as a pulling down control signal; an even numbered shift register, i.e. the corresponding shift register for driving a $(4n)^{th}$ gate line (for example, a fourth gate line, an eighth gate line, a twelfth gate line and so on), is connected to the fourth control line C4 and is input the fourth clock control signal CLK4, and the second clock control signal CLK2 is input as the pulling down control signal, wherein the n is a nature number other than 0.

In addition, the output terminal of each of the shift registers 11 in each set is further connected to two Thin Film Transistors (TFTs) $M_1$ and $M_2$, wherein sources of the two TFTs $M_1$ and $M_2$ both are connected to the output terminal of the shift register 11, drains of the two TFTs $M_1$ and $M_2$ both are connected to the low voltage signal line VSS. For each of the shift registers of the first set 10, gates of the two TFTs $M_1$ and $M_2$ are connected to the second control line C2 and the fourth control line C4 respectively, such that the clocks CLK2 and CLK4 for the second set are input. For each of the shift registers of the second set 20, gates of the two TFTs $M_1$ and $M_2$ are connected to the first control line C1 and the third control line C3 respectively, such that the clocks CLK1 and CLK3 for the first set are input.

In the present embodiment, the clock signals CLK1 and CLK3 are input to two adjacent shift registers in the first set 10 for driving two adjacent odd numbered gate lines; the clock signals CLK2 and CLK4 are input to two adjacent shift registers in the second set 20 for driving two adjacent even numbered gate lines, therefore, pulse signals of CLK1, CLK2, CLK3 and CLK4 sequentially lag one by one by a predefined time. The clock signals CLK2 and CLK4 used in the shift registers of the second set 20 are input to the two TFTs $M_1$ and $M_2$ connected the shift registers of the first set 10; the clock signals CLK1 and CLK3 used in the shift registers of the first set 10 are input to the two TFTs $M_1$ and $M_2$ connected the shift registers of the second set 20.

Figure 7A:
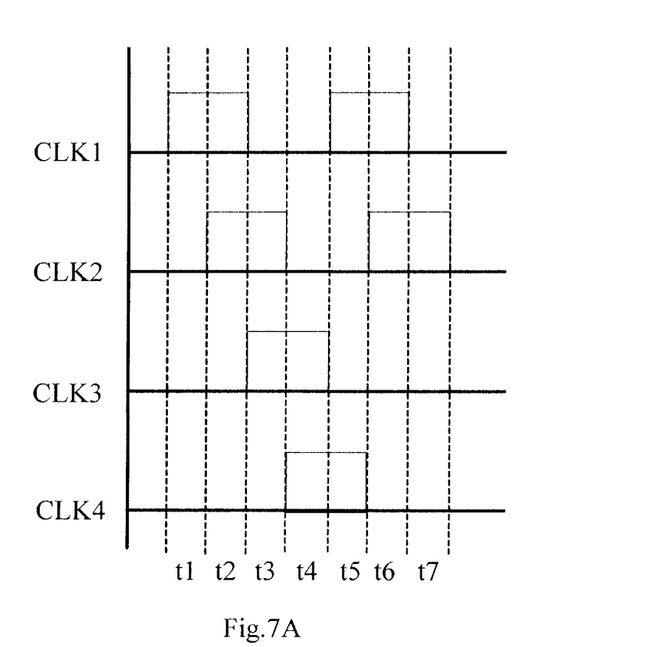
FIG. 7A and FIG. 7B are two cases of signal timing sequence diagrams of four clock signal lines in a second embodiment of the present disclosure respectively.
Figure 7B:
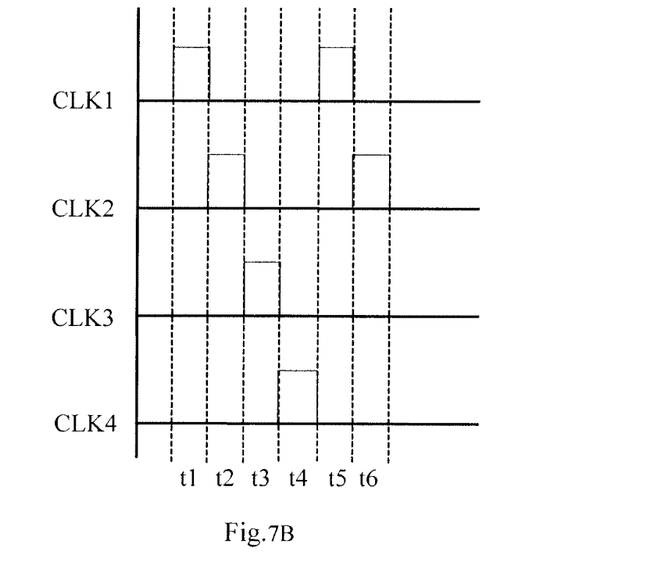

As shown in FIG. 5, the gate driving circuit provided in the present embodiment is basically the same as that provided in the first embodiment, difference lies in that: the four clock signal lines CLK1, CLK2, CLK3 and CLK4 are included in the present embodiment, wherein CLK2 lags CLK1 by ½ of a pulse width, CLK4 lags CLK3 by ½ of a pulse width, and a pulse signal of CLK1 and a pulse signal of CLK3 have reversed phases, a pulse signal of CLK2 and a pulse signal of CLK4 also have reversed phases (please refer to FIG. 7A), or the high levels of CLK1, CLK2, CLK3 and CLK4 are output sequentially in a pulse period (please refer to FIG. 7B).

Preferably, the high levels of CLK1, CLK2, CLK3 and CLK4 are output sequentially in a pulse period (please refer to FIG. 7B).

With reference to FIGS. 1-3, in the prior art, when the node PD is at a low level, especially during the time periods a and b shown in FIG. 2, the noises at the node PU and at the output terminal (OUTPUT) cannot be pulled down in time when they occur, thus causing a display defect in the display apparatus. In the present embodiment of the present disclosure, two TFTs are added at the output terminal of each of the shift registers in each set and are connected to the clock control signals of the other set. Still taking the odd numbered row circuit at the left hand of FIG. 5 as an example, during the time periods a and b of FIG. 2, even if the node PD is at the low level, the two added TFTs $M_1$ and $M_2$ are turned on by CLK2 and CLK4, and the output terminal of the shift register is connected to the low voltage signal line VSS via TFTs $M_1$ and $M_2$, such that the noise at the output terminal (OUTPUT) is pulled down, thus the output terminal of the row is pulled down during the whole non-operational period, and thus increasing quality of picture and reliability of the display apparatus. The even numbered row circuit at the right hand of FIG. 5 also has the same operational principle, difference only lines in that the two added TFTs $M_1$ and $M_2$ are turned on by CLK1 and CLK3, and the details are omitted.

Figure 8:
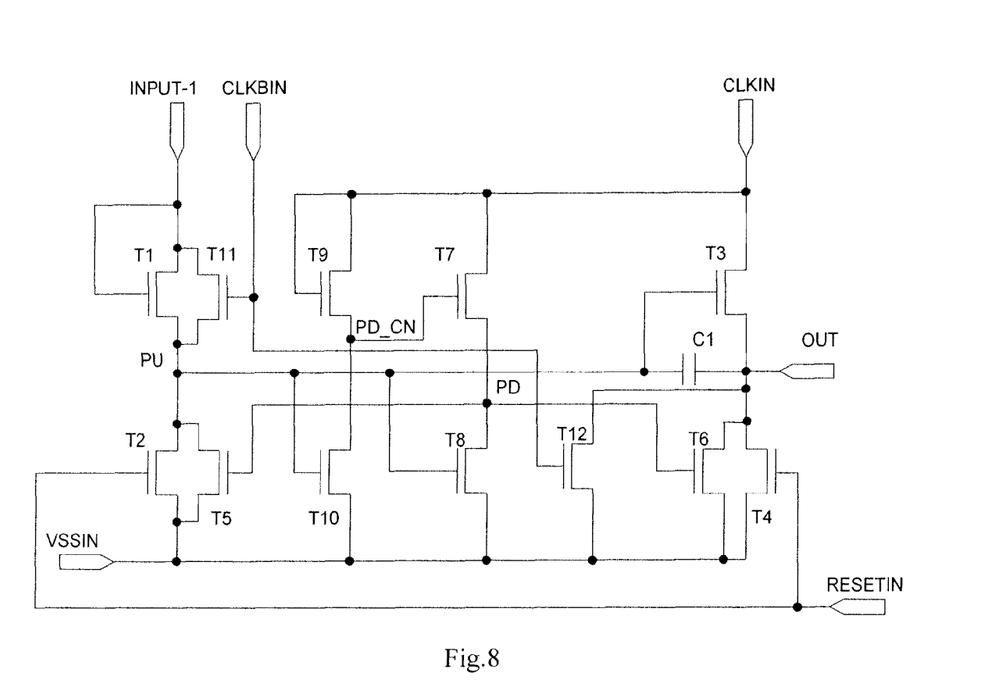
FIG. 8 is a schematic structure diagram of another shift register.

Although the shift register shown in FIG. 3 is taken as an example in the description of the present embodiment, other types of shift registers are not excluded, for example, another shift register shown in FIG. 8 can also be adopted, and the shift register shown in FIG. 8 has the similar operational principle, repetitive descriptions are omitted.

The shift register shown in FIG. 8 includes a first TFT T1, a second TFT T2, a third TFT T3, a fourth TFT T4, a fifth TFT T5, a sixth TFT T6, a seventh TFT T7, an eighth TFT T8, a ninth TFT T9, a tenth TFT T10, an eleventh TFT T11 and a twelfth TFT T12, and further includes a capacitor C1. A signal input terminal (INPUT-1) inputs an input signal (INPUT), a first clock signal input terminal (CLKIN) inputs a first clock signal (CLK), a second clock signal input terminal (CLKBIN) inputs a second clock signal (CLKB), a low voltage signal input terminal (VSSIN) inputs a low voltage signal (VSS), a reset signal input terminal (RESETIN) inputs a reset signal (RESET), and a signal output terminal (OUT) outputs a gate driving signal (OUTPUT). A point where a source of the first TFT T1, a drain of the second TFT T2, a gate of the tenth TFT T10 and a terminal of the capacitor are connected together is a node PU; a point where a gate of the fifth TFT T5, a gate of the sixth TFT T6, a drain of the eighth TFT T8 and a source of the seven TFT T7 are connected together is a node PD; and a point wherein a source of the ninth TFT T9, a gate of the tenth TFT T10 and a gate of the seventh TFT T7 are connected together is a node PD_CN; wherein the first clock signal input terminal (CLKIN) inputs the first clock signal (CLK), the second clock signal input terminal (CLKBIN) inputs the second clock signal (CLKB), and the first clock signal (CLK) and the second clock signal (CLKB) have reversed phases.

Furthermore, preferably, the output terminal of each of the shift registers (SR1~SRn) of each set is connected to two TFTs $M_1$ and $M_2$ via the gate line (S1~Sn) connected to the shift register, that is, one terminal of the gate line (S1~Sn) is connected to the output terminal of the shift register for receiving the driving signal, and the other terminal of the gate line is connected to the two TFTs for ensuring that the output terminal of the row is pulled down in the whole non-operational period.

In addition, it should be noted that the pulling down control signal of the pulling down unit in the shift register as shown in FIG. 3 is not limited to a direct current signal, but may also be a clock signal. Preferably, the pulling down control signal may be another clock signal having a reversed phase with the clock signal.

During an operational process of the shift register as shown in FIG. 2, there are five phases, in a first phase, the input signal (INPUT) at the signal input terminal (INPUT-1) is at a high level (wherein the input signal for the first shift register is the STV signal); in a second phase, the gate driving signal (OUTPUT) output by the signal output terminal (OUT) is at a high level, such that a shift is achieved; in a third phase, the reset signal (RESET) input by the reset signal input terminal (RESETIN) is at a high level to accomplish a resetting operation, so the first, second and third phases may be defined as the operational period of the shift register; in a fourth phase and a fifth phase, both the input signal (INPUT) at the signal input terminal (INPUT-1) and the reset signal (RESET) input by the reset signal input terminal (RESETIN) are at a low level, so the fourth and fifth phases may be defined as the non-operational period (such as the periods a and b in FIG. 2) of the shift register. Likewise, the operational process for other types of shift registers may also be divided based on the same principle.

In the prior art, terminals of each gate line in the bi-side parity alternate driving circuit are in a floating state, which may cause a current leakage due to a poor charge retention characteristics on the pixel unit, thus resulting in deterioration of quality of picture. However, in the embodiments of the present disclosure, one terminal of the gate line is connected to the shift register for receiving the driving signal, and the other terminal of the gate line is connected to the two TFTs, for ensuring that noise may be pulled down immediately once it occurs and improving the current leakage and the display defect due to the floating gate, and thus improving the quality of picture and reliability of the display apparatus.

Figure 6:
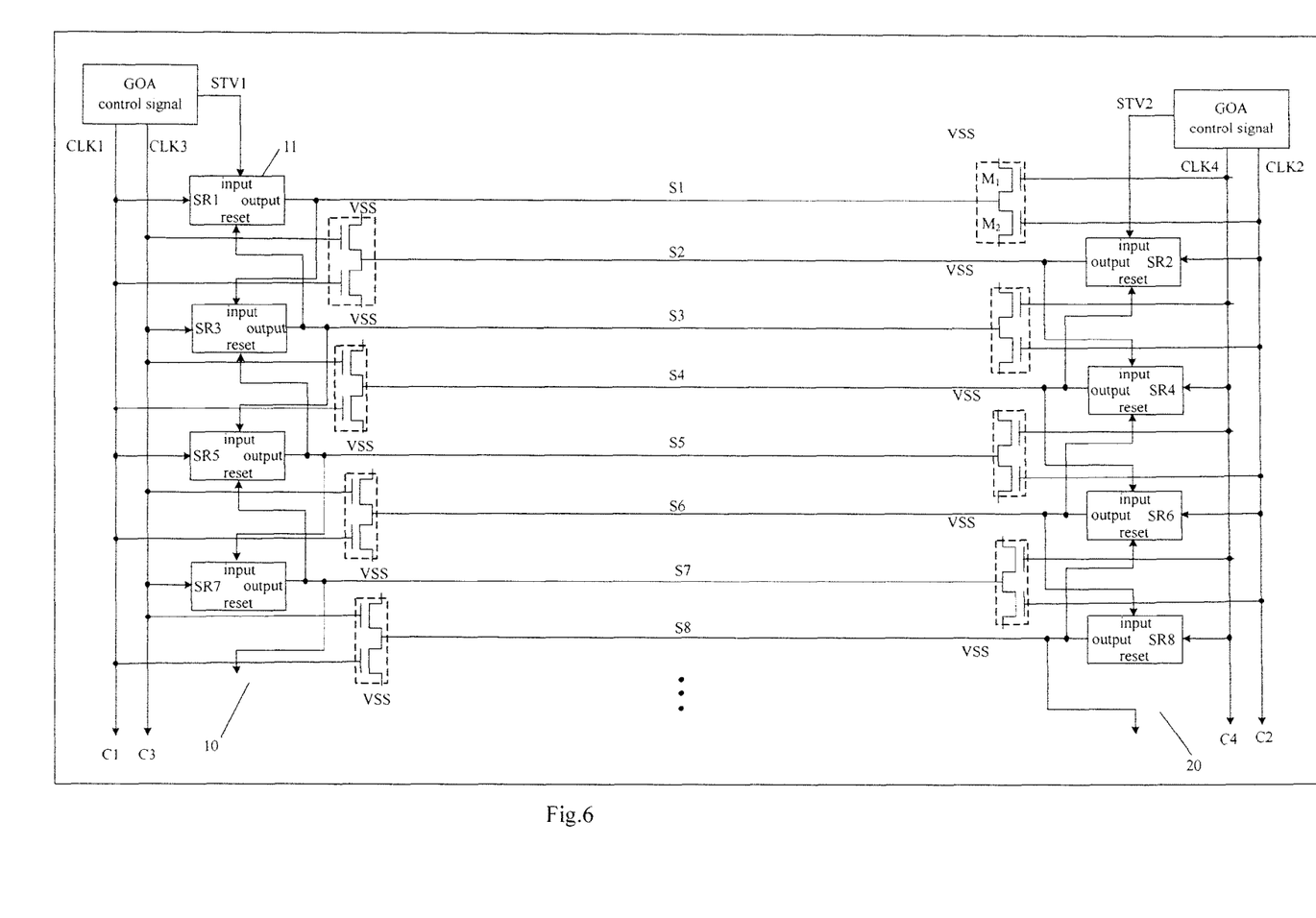
FIG. 6 is a schematic structure diagram of an array substrate in an embodiment of the present disclosure.

As shown in FIG. 6, embodiments of the present disclosure further provide an array substrate in which the gate driving circuit is arranged, wherein the first set 10 of cascaded shift registers and the second set 20 of cascaded shift registers in the gate driving circuit locate at edges of two opposite sides on the array substrate, respectively, and form two sides of a frame of a display apparatus.

The two TFTs corresponding to the corresponding shift register 11 of the first set 10 of cascaded shift registers locate at an edge of a side opposite to the first set of cascaded shift registers on the array substrate; and the two TFTs corresponding to the corresponding shift register 11 of the second set 20 of cascaded shift registers locate at an edge of a side opposite to the second set of cascaded shift registers on the array substrate. Therefore, for each of the shift registers of each set, the output terminal is connected to the two TFTs at the opposite side via the gate line (S1~Sn) connected to the shift register, that is, one terminal of the gate line (S1~Sn) is connected to the shift register for receiving the driving signal and the other terminal is connected to the two TFTs located at the opposite side. For example, the output terminal of the shift register SR1 is connected to a left terminal of the first gate line S1, and a right terminal of the first gate line S1 is connected to the two TFTs $M_1$ and $M_2$ located at the right edge of the array substrate, the gates of the two TFTs $M_1$ and $M_2$ are connected to the second control line C2 and the fourth control line C4, respectively, for receiving the clocks CLK2 and CLK4 in the second set.

In the array substrate in the embodiments of the present disclosure, it is ensured that noise may be pulled down immediately once it occurs and the current leakage and the display defect caused by the floating gate is improved, and thus increasing the quality of picture and reliability of the display apparatus.

The embodiments of the present disclosure further provide a display apparatus in which any of the array substrate is included. The display apparatus may be any of products or means having a displaying function, such as a liquid crystal panel, an electronic paper, an OLED panel, a mobile phone, a tablet computer, a television set, a display, a notebook computer, a digital photo frame, and a navigator.

The display apparatus provided in the embodiments of the present disclosure can ensure that noise may be pulled down immediately once it occurs and the current leakage and the display defect caused by the floating gate is improved since it adopts the gate driving circuit of the present disclosure, and thus increasing the quality of picture and reliability of the display apparatus.

Optionally, the first TFT and the second TFT in the above embodiments of the present disclosure may be Metal Oxide Semiconductor Field Effect Transistors (MOSFET) operating in a saturation region.

Technical features in the embodiments of the present disclosure may be combined arbitrarily when not being conflicted to each other.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure.

What is claimed is:

1. A gate driving circuit including two sets of cascaded shift registers, wherein each of shift registers in a first set of cascaded shift registers is connected to a corresponding odd row gate line, and each of shift registers in a second set of cascaded shift registers is connected to a corresponding even row gate line;
   each of the shift registers is further connected to two Thin Film Transistors TFTs, wherein sources of the two TFTs are both connected to an output terminal of a shift register, drains of the two TFTs are both connected to a first level signal line, and gates of the two TFTs receive a first control signal and a second control signal respectively, so that at least one of the two TFTs is turned on when the shift register to which the two TFTs are connected outputs a switching-off voltage;
   wherein a first clock signal and a second clock signal of the first set of cascaded shift registers are configured respectively to be the first control signal and the second control signal of the two TFTs connected to a corresponding shift register of the second set of cascaded shift registers, and a first clock signal and a second clock signal of the second set of cascaded shift registers are configured respectively to be the first control signal and the second control signal of the two TFTs connected to a corresponding shift register of the first set of cascaded shift registers.

2. The gate driving circuit of claim 1, wherein the first level signal line is a low voltage signal line Vss, and the switching-off voltage is a low level voltage.

3. The gate driving circuit of claim 1, wherein in each set of cascaded shift registers, except for a first shift register and a last shift register, an output terminal of each of the shift registers is connected to an input terminal of a next adjacent shift register and a reset signal input terminal of a previous adjacent shift register, an output terminal of the first shift register is connected to an input terminal of a second shift register, an output terminal of the last shift register is connected to a reset signal input terminal of a previous adjacent shift register and a reset signal input terminal of the last shift register;

an input terminal of the first shift register inputs a frame start signal;

for an odd numbered shift register, a first clock signal input terminal inputs a first clock signal, a second clock signal input terminal inputs a second clock signal; for an even numbered shift register, a first clock signal input terminal inputs the second clock signal, a second clock signal input terminal inputs the first clock signal;

a low voltage signal input terminal of each of the shift registers inputs a low voltage signal.

4. The gate driving circuit of claim 1, wherein, the first clock signal and the second clock signal of the first set of cascaded shift registers have reversed phases, the first clock signal and the second clock signal of the second set of cascaded shift registers also have reversed phases, and the first clock signal of the second set of cascaded shift registers lags the first clock signal of the first set of cascaded shift registers by ½ of a pulse width.

5. The gate driving circuit of claim 1, wherein, the first clock signal of the first set of cascaded shift registers, the first clock signal of the second set of cascaded shift registers, the second clock signal of the first set of cascaded shift registers, the second clock signal of the second set of cascaded shift registers are output sequentially in a pulse period.

6. The gate driving circuit of claim 1, wherein
for each of the shift registers, the output terminal is connected to the two TFTs via a gate line connected to the shift register;
one terminal of the gate line is connected to the output terminal of the shift register, and the other terminal of the gate line is connected to sources of the two TFTs.

7. The gate driving circuit of claim 1, wherein the two TFTs are Metal Oxide Semiconductor Field Effect Transistors.

8. An array substrate having the gate driving circuit of claim 1, arranged therein.

9. A display apparatus having the array substrate of claim 8 arranged therein.

10. The array substrate of claim 8, wherein the first set of cascaded shift registers and the second set of cascaded shift registers locate at edges of two opposite sides on the array substrate, respectively.

11. The array substrate of claim 10, wherein the two TFTs connected to the corresponding shift register of the first set of cascaded shift registers locate at an edge of a side opposite to the first set of cascaded shift registers on the array substrate; and
the two TFTs connected to the corresponding shift register of the second set of cascaded shift registers locate at an edge of a side opposite to the second set of cascaded shift registers on the array substrate.

\* \* \* \* \*